United States Patent
Heijden et al.

(10) Patent No.: US 8,228,125 B2
(45) Date of Patent: Jul. 24, 2012

(54) ELECTRONIC CIRCUIT WITH CASCODE AMPLIFIER

(75) Inventors: Mark Peter Heijden, Den Bosch (NL); Dominicus Leenaerts, Riethoven (NL); Melina Apostolidou, Enschede (NL)

(73) Assignee: ST-Ericsson SA, Geneva (CH)

( * ) Notice: Subject to any disclaimer, the term of this patent is extended or adjusted under 35 U.S.C. 154(b) by 42 days.

(21) Appl. No.: 12/734,538

(22) PCT Filed: Nov. 10, 2008

(86) PCT No.: PCT/EP2008/065231
§ 371 (c)(1),
(2), (4) Date: Sep. 7, 2010

(87) PCT Pub. No.: WO2009/060095
PCT Pub. Date: May 14, 2009

(65) Prior Publication Data
US 2011/0012682 A1  Jan. 20, 2011

(30) Foreign Application Priority Data
Nov. 9, 2007 (EP) .................................. 07120318

(51) Int. Cl.
*H03F 1/22* (2006.01)
(52) U.S. Cl. ................................................. 330/311
(58) Field of Classification Search .......... 330/292, 330/311
See application file for complete search history.

(56) References Cited

U.S. PATENT DOCUMENTS

| 3,940,683 | A | 2/1976 | Blauschild |
| 4,317,055 | A | 2/1982 | Yoshida et al. |
| 4,394,590 | A | 7/1983 | Honda |
| 4,751,408 | A | 6/1988 | Rambert |
| 7,276,976 | B2 * | 10/2007 | Oh et al. ............... 330/311 |
| 7,355,479 | B2 * | 4/2008 | Van Der Heijden ........ 330/292 |

FOREIGN PATENT DOCUMENTS
JP  54075980  6/1979

OTHER PUBLICATIONS

International Search Report dated Mar. 26, 2009 in connection with International Patent Application No. PCT/EP2008/065231.
Written Opinion of the International Searching Authority dated Mar. 26, 2009 in connection with International Patent Application No. PCT/EP2008/065231.

* cited by examiner

*Primary Examiner* — Steven J Mottola

(57) ABSTRACT

An electronic circuit has an amplifier with an amplifying transistor and a cascode transistor. A capacitive voltage divider applies a fraction of an RF signal swing from the drain of the cascode transistor to the gate of the cascode transistor, the fraction being determined by a ratio between capacitance values. In addition a bias voltage supply circuit is provided. The bias voltage supply circuit is configured to define a relation between an average gate voltage of the cascode transistor and an average drain supply voltage at the drain of the cascode transistor. This relation increases the average gate voltage with increasing average drain voltage, and the relation provides a non zero average gate voltage when extrapolated to zero average drain supply voltage.

7 Claims, 2 Drawing Sheets

ELECTRONIC CIRCUIT WITH CASCODE AMPLIFIER

CROSS-REFERENCE TO RELATED APPLICATION(S)

The present application claims priority under 35 U.S.C. §365 to International Patent Application No. PCT/EP2008/065231 filed Nov. 10, 2008, entitled "ELECTRONIC CIRCUIT WITH CASCODE AMPLIFIER". International Patent Application No. PCT/EP2008/065231 claims priority under 35 U.S.C. §365 and/or 35 U.S.C. §119(a) to European Patent Application No. 07120318.6 filed Nov. 9, 2007 and which are incorporated herein by reference into the present disclosure as if fully set forth herein.

FIELD OF THE INVENTION

The invention relates to a circuit with an amplifier that includes a cascode transistor.

BACKGROUND OF THE INVENTION

An amplifier with a cascode transistor is known from an article titled "A 2.4-GHz 0.18- m CMOS Self-Biased Cascode Power Amplifier", by Tirdad Sowlati, and Domine M. W. Leenaerts and published in the IEEE Journal of Solid-State Circuits, vol. 38, no. 8, Aug. 2003. This amplifier has a resonant load circuit that has the effect that voltage across at the drain of the cascode transistor can swing to several times the power supply voltage Vdd. This gives rise to a risk of cascode transistor breakdown. The article proposes to make the gate voltage of the cascode transistor swing with an attenuated version of the output swing.

FIG. 1 shows one embodiment of an amplifier. The circuit comprises and amplifier transistor 10, a cascode transistor 12 and a resonant load circuit 14. The drain of the cascode transistor 12 is coupled to its gate by a resistor 16 and the gate is coupled to ground via a capacitor 18. Thus an RC circuit is used to generate an attenuated swing at the gate of the cascode transistor. This solves the breakdown problem by reducing the voltage differences between the terminals of the cascode transistor.

U.S. Pat. No. 4,317,055 describes a high voltage cascode amplifier that is protected against unduly high power supply voltages of hundreds of volts by deriving the gate voltage from the power supply voltage with a voltage divider. This reduces the static voltage differences between the terminals of the cascode transistor. Thereby the power supply voltage at which breakdown occurs is increased. Moreover this patent proposes to use an additional voltage source to raise the gate voltage above the voltage obtained from the voltage divider by at least a transistor threshold voltage. This is used to avoid that the cascode transistors is biased below its threshold, which would dramatically increase the "on" resistance of the channel of the cascode transistors.

Neither document addresses the optimization of the efficiency of the amplifier.

SUMMARY OF THE INVENTION

Among others it is an object to improve the efficiency of a circuit with a cascode amplifier.

An electronic circuit according to claim 1 is provided. Herein a capacitive voltage divider and a bias supply voltage circuit are provided, to determine an RF swing at the gate of a cascode transistor and an average voltage at the gate of the cascode transistor respectively. The bias voltage supply circuit defines a relation between an average gate voltage of the cascode transistor and an average drain supply voltage at the drain of the cascode transistor. This relation increases the average gate voltage with increasing average drain voltage, and the relation provides a non zero average gate voltage when extrapolated to zero average drain supply voltage. As used herein the RF swing is the signal swing caused by the input signal swing of the amplifier. As used herein, "average" voltage refers to a voltage substantially ignoring any RF voltage swing in the voltage around the average.

In an embodiment the capacitive voltage divider is configured to maximize the voltage at the drain of the cascode transistor at which break-down of any transistor of the amplifier may occur. In an embodiment the bias voltage supply circuit is configured to maximize power efficiency of the amplifier. The capacitive voltage divider and the bias voltage supply circuit may optimize the breakdown voltage and the efficiency at the same time.

In an embodiment the capacitive voltage divider applies fraction of the drain voltage of the cascode transistor to its gate. In an embodiment this fraction is smaller than a ratio between the average gate voltage of the cascode transistor supplied by the bias voltage supply circuit and the average drain supply voltage. Thus, it is possible to use an amplifying transistor that has a lower breakdown voltage than the cascode transistor, to provide for improved amplifier gain.

In an embodiment the bias voltage supply circuit comprises a resistive voltage divider coupled between the drain of the cascode transistor and the power supply reference connection with a divided voltage output coupled to the gate of the cascode transistor; and an offset voltage source coupled to the gate of the cascode transistor. Thus a simple way of generating the average bias is realized. It has been found that optimal efficiency can substantially be achieved by such a circuit.

The capacitive voltage divider may be realized by an intrinsic drain-gate capacitance of the cascode transistor in combination with a capacitor coupled between the gate of the cascode transistor and a power supply reference connection. Optionally an additional capacitor may be used in parallel with the intrinsic capacitor. The capacitance value of the capacitor to the power supply reference may be selected in relation to the ratio between the intrinsic capacitance (plus optionally the additional capacitor) to set the fraction of the RF voltage swing that will be supplied to the gate of the cascode transistor.

In an embodiment variation of the average drain voltage of the cascode transistor is used to modulate the RF signal.

BRIEF DESCRIPTION OF THE DRAWING

These and other objects and advantageous aspects will become apparent from a description of exemplary embodiments, using the following Figures.

DETAILED DESCRIPTION OF EXEMPLARY EMBODIMENTS

Figure 1:
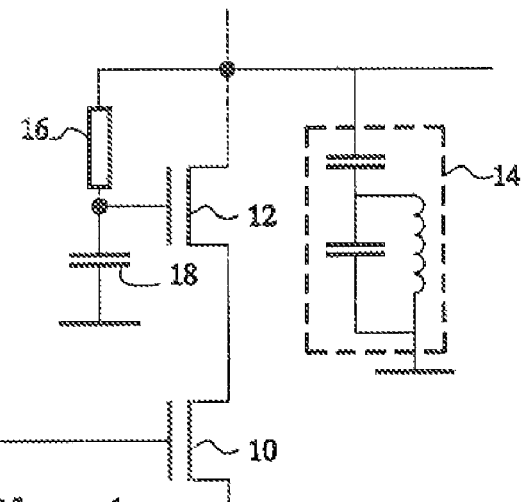
FIG. 1 shows an amplifier according to one embodiment of the present disclosure.
Figure 2:
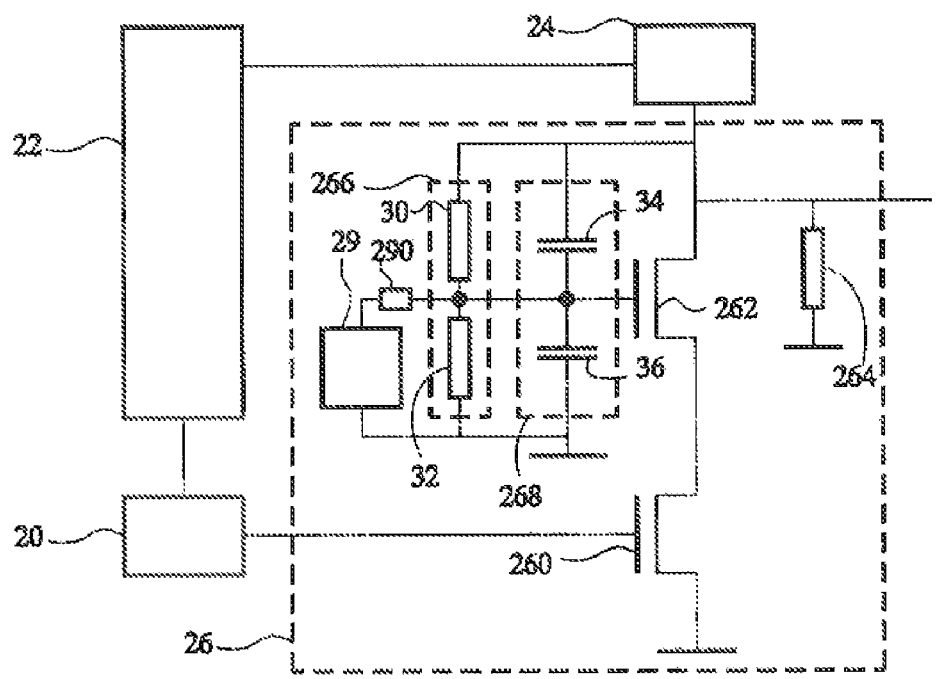
FIG. 2 shows an electronic circuit

FIG. 2 shows an electronic circuit comprising an RF signal source 20, a modulation source 22, a voltage control circuit 24 and an amplifier 26. Modulation source 22 has a first output coupled to phase and/or frequency control input of RF signal source 20. RF signal source 20 has an RF output coupled to a signal input of amplifier 26. Modulation source 22 has a second output coupled to a control input of voltage control circuit 24. Voltage control circuit 24 has a voltage output coupled to a supply voltage input of amplifier 26. In operation modulation source 22 uses RF signal source 20 to modulate the phase and/or frequency of the RF signal and modulation source 22 uses voltage control circuit 24 and amplifier 26 to realize a modulation of the amplitude of the RF signal, by varying a supply voltage that is applied to amplifier 26. Voltage control circuit 24 is configured to control the average supply voltage of amplifier 26, while allowing RF voltage swing at the supply input of amplifier 26. This may be realized for example by including an inductance and/or a large resistance in voltage control circuit 24, coupled between amplifier 26 and a remainder of voltage control circuit 24.

Amplifier 26 comprises an amplifying transistor 260, a cascode transistor 262, a load circuit 264, a resistive voltage divider 266, a capacitive voltage divider 268 and an offset voltage source 29. The source of amplifying transistor 260 is coupled to ground. The gate of amplifying transistor 260 is coupled to the RF output of RF signal source 20. The drain of amplifying transistor 260 is coupled to the source of cascode transistor 262. The drain of cascode transistor 262 is coupled to load circuit 264, which may be a resonant load circuit.

In an embodiment amplifying transistor 260 and cascode transistor 262 are of different type, cascode transistor 262 having a thicker gate oxide than amplifying transistor 260. As a result amplifying transistor 260 will have a larger bandwidth and a higher RF gain than cascode transistor 262, and cascode transistor 262 will have a larger breakdown voltage than amplifying transistor 260. Thus, cascode transistor 262 provides most of the protection against breakdown, whereas amplifying transistor 260 provides more gain because it only has to provide a small part of the protection against breakdown.

Resistive voltage divider 266 comprises a first resistor 30 coupled between the drain of cascode transistor 262 and the gate of cascode transistor 262. Furthermore, resistive voltage divider 266 comprises a second resistor 32 coupled between the gate of cascode transistor 262 and ground. Similarly, capacitive voltage divider 266 comprises a first capacitor 36 coupled between the drain of cascode transistor 262 and the gate of cascode transistor 262. Furthermore, capacitive voltage divider 268 comprises a second capacitor 38 coupled between the gate of cascode transistor 262 and ground. In an embodiment, first capacitor 36 may be an intrinsic capacitor of cascode transistor 262. Offset voltage source 29 comprises a third resistor 290 coupled between a power supply terminal Vdd and ground.

In operation capacitive voltage divider 266 functions to reduce voltage differences between the terminals of cascode transistor 262. Resistive voltage divider 266 functions to improve, and preferably to optimize, power efficiency of amplifying transistor 260 and cascode transistor 262. In an embodiment the input signal at the gate of amplifying transistor 260 is so large that amplifying transistor 260 does not operate as a linear amplifier, but more nearly as an on/off switch circuit. In this embodiment optimization of efficiency involves selecting the gate voltage of cascode transistor 262 to keep the drain voltage of amplifying transistor 260 so high that amplifying transistor can supply the necessary current at maximum current through cascode transistor 262, but not higher than that. The resistance values of the resistors in resistive voltage divider 266 are selected to realize such a setting in this embodiment. In general, the optimal selection may be determined by means of circuit simulation techniques or experimentally by varying the gate voltage and determining the resulting efficiency.

The resistance of the resistors in resistive voltage divider 266 are so high that the impedance of resistive voltage divider 266 is much higher (e.g. at least ten times higher) than the impedance of capacitive voltage divider 268. Thus, capacitive voltage divider 266 substantially determines the voltage swing at the gate of cascode transistor 262 and resistive voltage divider 266 determines the average voltage at the gate of cascode transistor 262. Offset voltage source 29 assists resistive voltage divider 268 to further improve and preferably optimize impedance efficiency of amplifier 26.

Figure 3:
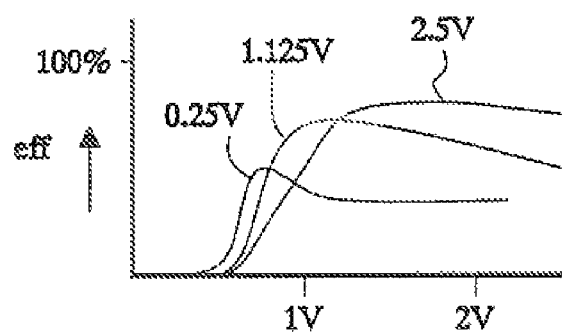
FIG. 3 shows a graph of efficiency versus cascode gate voltage

FIG. 3 shows graphs of amplifier efficiency (eff) versus cascode transistor gate voltage for a number of different cascode transistor 262 drain supply voltages from voltage control circuit 24. Efficiency is the ratio between the supply power that amplifier 26 receives and RF signal power output from amplifier 26. As can be seen, the efficiency depends on the gate voltage of cascode transistor 262. For a given drain supply voltage the efficiency peaks at a certain optimum gate voltage. As can be seen, this optimum gate voltage depends on the drain supply voltage. It has been found that this dependence is approximately linear. The parameters of the linear dependence may depend on the transistors and supply voltages used. By means of circuit simulation, suitable parameters can be determined. In an example, a dependence according to Vg=0.63+0.47 Vd was found to be optimal, wherein Vg is the gate voltage of the cascode transistor and Vd is the drain supply voltage.

Offset voltage source 29 and resistive voltage divider 266 are configured to set the actual gate voltage at or near the optimum gate voltage according to such a linear dependence. Resistive voltage divider 266 ensures that the gate voltage varies linearly with drain supply voltage. Offset voltage source 29 sets the extrapolated value of the gate voltage when the drain supply voltage is extrapolated to zero. Such a linear dependence can be implemented by providing an offset voltage source and resistances with a suitable ratio in resistive voltage divider 268, using basic circuit theory. As will be realized many resistor network topologies can be used to realize such a linear dependence. In the circuit of FIG. 2 for example Vg=a+b*Vd, with $$a = R1R2/(R1R2 + R1R3 + R2R3)$$

and $$b = R1R3/(R1R2 + R1R3 + R2R3)$$

Herein R1 is the resistance value of resistor 290, R2 is the resistance value of resistor 30 and R3 is the resistance value of resistor 32. Inversely, R1=R3 *(Vd(1−b)−a)/a and R2=R3 *(Vd(a−b)−a)/(b*Vd). Hence, only the ratio between the resistances is relevant. Other relations can easily be derived according to the circuit used.

The capacitance values in the capacitive voltage divider may be selected in proportion to the ratio of the drain-gate breakdown voltages of the amplifying transistor and the cascode transistor. In one example, amplifying transistor 260 may be of a type that has a breakdown voltage of 1.3 Volts and cascode transistor may be of a type with a breakdown voltage of 8 Volts. In this example the voltage division ratio of the capacitive voltage divider is set to about 1.3:8, whereas the resistive voltage divider is selected to realize a division ratio of 0.47 as described in the preceding. The former ratio maximizes the breakdown voltage and the latter ratio optimizes efficiency. Of course, different ratios may be needed, dependent on transistor types. When these breakdown voltages are equal to each other, the capacitances in the capacitive voltage divider may be selected to make the drain-gate voltages of the amplifying transistor and the cascode transistor equal to each other. The capacitances in the capacitive voltage divider may be separate capacitances, but in an alternative embodiment the intrinsic drain-gate capacitance of the cascode transistor may be used as one of the capacitances.

Although an embodiment has been shown wherein one cascode transistor is used, it should be understood that a plurality of cascode transistors may be used in cascode. In this embodiment each cascode transistors may have its own resistive and capacitive voltage divider to maximize the breakdown amplitude and to optimize efficiency respectively. Furthermore, although an application to phase and amplitude modulation has been illustrated, it should be appreciated that a similar circuit may be used for amplitude modulation only, or for other applications wherein a variable drain voltage is applied to the cascode transistor.

Although examples of voltage divider circuits have been shown, it should be appreciated that voltage division and addition of an offset can be realized by other circuits, for example by circuits containing more resistors or capacitors in parallel or in series. In an embodiment third resistor 290 of offset voltage source 29 may perform the function of second resistor 32 of resistive voltage divider 266 as well. The circuit may have positive or negative power supply, with the transistors correspondingly being of NMOS or PMOS type.

Instead of the analog controlled resistive voltage divider as shown, a digitally controlled voltage generator may be used. In this embodiment analog to digital converters may be used to generate the drain supply voltage of the cascode transistor 262 and the gate voltage of this cascode transistor under control of a common digital modulation control signal. A look-up table circuit may be used to generate the input signals for the analog to digital converter for the gate voltage of the cascode transistor, so as to optimize efficiency for each modulation control circuit. In this case the lookup table realizes substantially the same relation between the drain supply voltage and the gate voltage as the resistive divider and the offset circuit, which has an extrapolation greater than zero when the drain supply voltage is extrapolated to zero, and an increasing gate voltage with increasing drain supply voltage, preferably selected to optimize efficiency. An advantage of a digital circuit is that deviations from the linear dependence can be implemented to provide for further optimization of efficiency. Alternatively the analog to digital converter for the gate voltage of the cascode transistor may be configured to realize the required relation.

Figure 4:
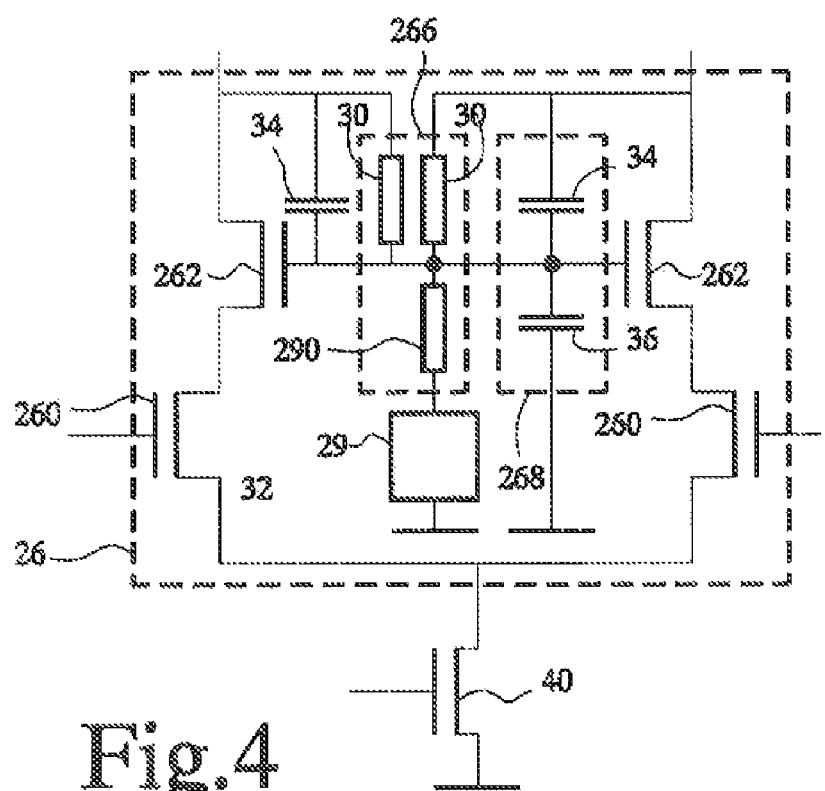
FIG. 4 shows an amplifier

FIG. 4 shows a differential embodiment of the amplifier 26. Herein a current source 40 is coupled to two branches, each branch containing an amplifying transistor 260 and a cascode transistor 262. In this embodiment combined voltage division of voltages from the drains of the cascode transistors 262 is used to provide the gate voltage that optimizes efficiency. Similarly combined RF voltage division with capacitors is used to protect against breakdown. In operation a differential signal may be applied to the gates of amplifying transistors 260 and signals from the drains of cascode transistors 262 may be applied to a load circuit or load circuits (not shown).

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An electronic circuit comprising an amplifier, the amplifier comprising:
   an amplifying transistor comprising a gate, source and drain, the gate being coupled to an input for receiving a radio frequency (RF) input signal, the source being coupled to a power supply reference connection;
   a cascode transistor comprising a gate, source and drain, the source of the cascode transistor being coupled to the drain of the amplifying transistor;
   a capacitive voltage divider comprising first and second capacitors, the capacitive voltage divider configured to apply a fraction of an RF signal swing from the drain of the cascode transistor to the gate of the cascode transistor, the fraction being determined by a ratio between capacitance values of the first and second capacitors;
   a bias voltage supply circuit comprising a voltage output coupled to the gate of the cascode transistor, the bias voltage supply circuit configured to define a relation between an average gate voltage of the cascode transistor and an average drain supply voltage at the drain of the cascode transistor, the relation configured to increase the average gate voltage in proportion to an increased average drain voltage, and the relation configured to provide a non zero average gate voltage when the average gate voltage is extrapolated to zero;
   a modulation control circuit; and
   a voltage generator circuit comprising a control input coupled to the modulation control circuit and a cascode transistor output coupled to the drain of the cascode transistor configured to supply the average drain supply voltage under control of the modulation control circuit,
   wherein the cascode transistor has a higher drain-gate breakdown voltage than the amplifying transistor and wherein the capacitive voltage divider is configured to make the fraction smaller than a ratio defined by the relation, the ratio comprising the average gate voltage of the cascode transistor supplied by the bias voltage supply circuit divided by the average drain supply voltage.

2. An electronic circuit according to claim 1, wherein the bias voltage supply circuit comprises:
   a resistive voltage divider coupled between the drain of the cascode transistor and the power supply reference connection, the resistive voltage divider including a divided voltage output coupled to the gate of the cascode transistor; and
   an offset voltage source coupled to the gate of the cascode transistor.

3. An electronic circuit according to claim 1, wherein the capacitive voltage divider is configured to set the fraction of the RF signal swing so that a ratio between RF drain-gate voltages of the cascode transistor and the amplifying transistor at maximum drain supply voltage is substantially equal to a ratio between drain-gate breakdown voltages of the cascode transistor and the amplifying transistor.

4. An electronic circuit according to claim 1, wherein the bias voltage supply circuit is configured to set the average gate voltage of the cascode transistor substantially at a value where a maximum power efficiency of the amplifier as a function of average cascode transistor gate voltage occurs.

5. An electronic circuit according to claim 1, wherein the first capacitor comprises an intrinsic drain-gate capacitance of the cascode transistor and the second capacitor is coupled between the gate of the cascode transistor and the power supply reference connection.

6. An electronic circuit according to claim 1, further comprising a load circuit coupled to the drain of the cascode transistor.

7. An electronic circuit according to claim 6, wherein the load circuit comprises a resonant circuit.

* * * * *